United States Patent [19]

Han et al.

[11] Patent Number: 5,409,848
[45] Date of Patent: Apr. 25, 1995

[54] ANGLED LATERAL POCKET IMPLANTS ON P-TYPE SEMICONDUCTOR DEVICES

[75] Inventors: Yu-Pin Han, Dallas, Tex.; Samuel J. S. Nagalingam, Los Gatos, Calif.

[73] Assignee: VLSI Technology, Inc., San Jose, Calif.

[21] Appl. No.: 221,740

[22] Filed: Mar. 31, 1994

[51] Int. Cl.[6] .......................................... H01L 21/265
[52] U.S. Cl. ............................... 437/35; 148/DIG. 18
[58] Field of Search .................. 148/DIG. 18; 437/35

[56] References Cited

U.S. PATENT DOCUMENTS

| | | |
|---|---|---|
| 3,660,735 | 5/1972 | McDougall . |
| 3,914,857 | 10/1975 | Goser et al. . |
| 4,417,385 | 11/1983 | Temple . |
| 4,466,178 | 8/1984 | Soclof . |
| 4,613,882 | 9/1986 | Pimbley et al. . |
| 4,698,899 | 10/1987 | Kakihana . |
| 4,855,247 | 8/1989 | Ma et al. . |
| 4,931,408 | 6/1990 | Hshieh . |
| 4,963,504 | 10/1990 | Huang . |
| 4,975,385 | 12/1990 | Beinglass et al. . |
| 4,978,626 | 12/1990 | Poon et al. . |
| 5,045,898 | 9/1991 | Chen et al. . |
| 5,100,810 | 3/1992 | Yoshimi et al. . |
| 5,147,811 | 9/1992 | Sakagami ............................ 437/35 |
| 5,217,910 | 6/1993 | Shimizu et al. ...................... 437/35 |

FOREIGN PATENT DOCUMENTS

| | | | |
|---|---|---|---|
| 3262130 | 11/1991 | Japan ........................... | 437/35 |

OTHER PUBLICATIONS

Wolf et al., vol. II, Silicon Processing for the VLSI Era, Lattice Press, 1990 pp. 370–385.
"A New Submicron MOSFET with LATID (Large-Tilt Angle Implanted Drain) Structure" Takashi Hori et al. pp. 15 & 16.
"Mechanism Analysis of A Highly Reliable Graded Junction Gate/N- Overlapped Structure in MOSLDD Transistor", Okumura et al, pp. 477–480, 1989.
"Angled Implant Fully Overlapped LDD(AI-FOLD) NFETs For Performance And Reliability" Bryant et al., pp. 152–157, 1989.
"$\frac{1}{4}$-$\mu$m LATID (LArge-Tilt-angle Implanted Drain) Technology For 3.3-V Operation", Hori et al., pp. 32.4.1–32.4.4, 1989.
"A New MOSFET with Large-Tilt-Angle Implanted Drain (LATID) Structure", Hori et al. 1988.
"Optimum Design of Gate/N Overlapped LDD Transistor", Inuishi et al., pp. 4-4-4-5.
A. Hori et al., IEEE Electron Device and Letters, 43 (1992) 174.
Y. Okumura et al., IEDM Tech. Dig. (1990) 391.

Primary Examiner—Brian E. Hearn
Assistant Examiner—Lynne A. Gurley
Attorney, Agent, or Firm—Burns Doane Swecker & Mathis

[57] ABSTRACT

The punchthrough capacity of a p-type semiconductor device is significantly improved by nonuniformly doping the p-channel with n-type implants such as phosphorus. The n-type dopants are implanted at large angles to form pocket implants within the channel region. The dose of the implants, angle of the implants and the thermal cycle annealing of the implants will be optimized for maximum punchthrough capability without substantially detracting from the performance of the semiconductor device.

20 Claims, 1 Drawing Sheet

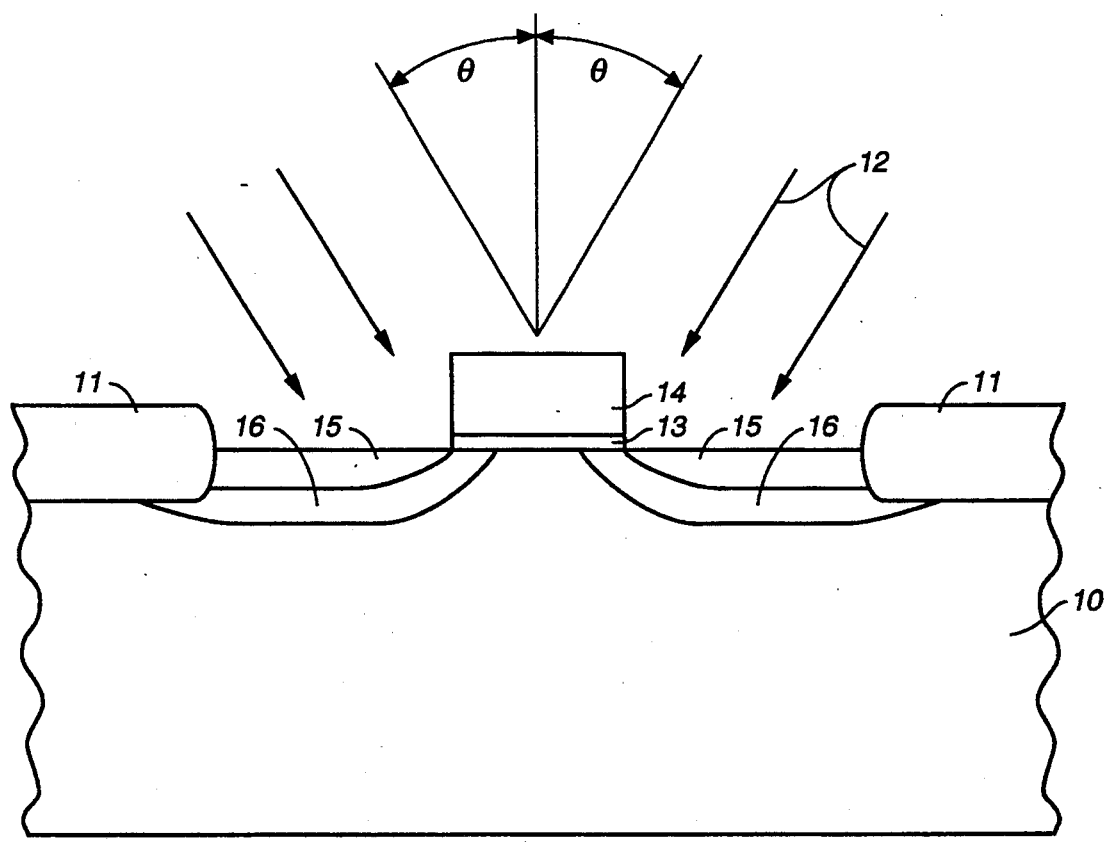
FIG._1

ANGLED LATERAL POCKET IMPLANTS ON P-TYPE SEMICONDUCTOR DEVICES

TECHNICAL FIELD

The present invention relates to a method of nonuniformly doping a MOSFET using angled lateral pocket implants. Additionally, the present invention relates to a semiconductor device manufactured by angularly implanting dopants within the substrate.

BACKGROUND OF THE INVENTION

One of the most useful and advantageous electrical devices is the field effect transistor (FET). Very large scale integrated (VLSI) circuits have been created using metal-oxide-semiconductor (MOS) field effect transistors. These so-called MOSFET devices take their name from the structure of the device in the vicinity of the gate. The gate electrode typically comprises a metal layer insulated by a silicon oxide layer from a doped semiconductor layer beneath the oxide. In the present invention, the problems addressed are the control of threshold voltage, parasitic junction capacitance, current mobility and punchthrough resistance.

Decreased cost and improved performance provide an impetus for miniaturizing MOSFETs. Continuing advances in lithography and etching will permit even greater reduction in device size. Unfortunately, for reason such as the compatibility with existing systems, the power supply voltages used in such devices usually fail to decrease with increasing circuit density. As a result of this violation of ideal scaling, electric field strength levels within the device increase as geometric distances shrink. High field effects within MOS devices include carrier mobility reduction and channel hot electron instability in MOSFETs, particularly n-channel MOSFETs or, NMOSFETs. Electrons flowing from the source to drain regions of an n-channel FET gain energy from the lateral electric field component. This component of electric field is parallel to the interface between the silicon semiconductor and the silicon oxide insulating layer beneath the gate electrode. Energetic electrons tend to surmount the silicon/silicon-oxide energy barrier and are trapped within the oxide gate insulator or generate undesirable interface states by mechanisms which are not yet fully understood. Therefore, in devices with an effective channel length of 1 $\mu$m or less, simply scaling down the device dimensions, without changing the supply voltage, generally results in deteriorated performance and often causes device failure.

While improvements in hot electron effect problems can be partially effected by increasing the thickness of the gate oxide, this is an undesirable option because it reduces gate control effects and results in slower operating devices.

It has been proposed for n-channel devices (NMOSFETs) by Y. Okumura, et al., A Novel Source-to-Drain Nonuniformly Doped Channel (NUDC) MOSFET for High Current Drivability and Threshold Voltage Controllability, IEDM (1990), the disclosure of which is incorporated herein by reference in its entirety, to implant boron ions at an oblique angle in a channel region to form a nonuniformly doped channel (MOSFET). However, hot electron effects are much less severe in PMOS devices than NMOS devices.

A new LDD (lightly doped drain) structure for PMOS devices, called a halo LDD is described in M. L. Chen, et al., Tech. Dig. IEDM, 1988, page 390. In this structure, a deeper phosphorous implant is placed below the lightly doped drain-extension p-type implant. The punchthrough resistance of the PMOS device is reported to be significantly improved by this LDD structure.

A Novel Source-to-Drain Nonuniformly Doped Channel (NUDC) MOSFET for High Current Drivability and Threshold Voltage Controllability, by Okumura et al., IEEE, 1990, page 15.5.1; relates to a novel source-to-drain nonuniformly doped channel (NUDC) MOSFET having increased mobility as compared with that of the conventional channel MOSFET. In particular, the article relates to the use of oblique rotating ion implantation of boron after the formation of a sidewall oxide. This type of boron implantation is said to reduce the threshold voltage of polysilicon having gate length (L) both in the linear region and saturation region.

A Self-Aligned Pocket Implantation (SPI) Background Technology for 0.2-$\mu$m Dual-Gate CMOS, by Hori et al., IEEE Electron Device letters, Vol. 43, No. 4, 1992, page 174; relates to a novel self-aligned pocket implantation (SPI) featuring localized "pocket" implantation using a gate electrode and $TiSi_2$ film as self-aligned masks. The process is said to provide high punchthrough resistance and high current driving capability while suppressing the impurity concentration in the twin well. The drain junction capacitance is said to decrease by 30% for NMOSFET and by 49% to PMOSFET as compared to conventional LDD devices.

U.S. Pat. No. 4,613,882 discloses a buried spacer and a surface spacer which are employed together to move high-density current flow away from the silicon/silicon-oxide interface boundary without significant adverse current-voltage effects. More specifically, a lightly doped buried n-type region is developed by ion implantation in source or drain regions on either side of the gate electrode by means of a high voltage field. The n-doped region lies below and space apart from the silicon/silicon-oxide boundary. This n-doped region is formed by implantation at high voltage. A second, light or low concentration n-dopant such as arsenic, is also implanted, but at the surface of the device. Silicon-oxide spacers on either side of the gate electrode are then formed by a process such as reactive ion etching. A third ion implantation operation is then performed at an increased dopant concentration but at a lower ion implant field strength. As a result of this process, more lightly doped n and n⁻ regions extend from the source and drain at and beneath the semiconductor surface.

U.S. Pat. No. 5,100,810 relates to a method of simultaneously manufacturing n-p-n BIP elements and MOS field-effect transistors (MOSFETs). In particular, a semiconductor layer composed of a semiconductor layer of one conductivity type on which a high-concentration semiconductor layer of the same type is formed on the surface of a insulating substrate. By selectively etching the semiconductor layer, the high-concentration external base region of the first conductivity type is left, and at the same time, only a thicker prospective internal base region just under the external base region and a prospective emitter region and prospective collector region, which are located at both sides of the prospective internal base region and have steps between themselves and the prospective internal base region, are left to form island regions. A sidewall insulating film is formed which covers at least a sidewall on the prospective collector region side among sidewalls of the external base region and sidewalls at the steps of the prospective internal base region adjoining the sidewalls of the external base region. The emitter region and collector region of the second conductivity type are formed by ion implantation perpendicular to the substrate with the insulating film covering the external base region and the sidewall insulating film as blocking mask. For example, by using resist films as blocking masks, boron ions are diagonally implanted in the substrate, e.g., at a tilt angle of 45° to the substrate, at an acceleration voltage of 50 kV at a dose of $1 \times 10^{13}$ cm$^2$ to form an ion implantation layer just under the external base region in the island element region.

U.S. Pat. No. 3,914,857 discloses a two-phase ion implantation process. In pertinent part, the process comprises subjecting the gaps between the electrodes on a semiconductor to an ion implantation beam directed at one corner of each gap at a relatively small angle to the plane of the substrate so as to cause ions to be implanted below one edge region of each electrode. Subsequently, the gaps are subjected to a second ion implantation beam directed at an oblique angle to the substrate which is larger than the angle of the first ion beam. In order to cause ions to be implanted in the substrate beneath each gap but spaced from the edge of the gap which lies opposite to the side of the first edge. For example, in a n-conducting substrate, phosphorous ions are implanted into the edge zones as a first ion implantation step. Next, a complimentary type of ion is implanted at a much more oblique angle. That is, for an n-conducting substrate boron ions are implanted into the substrate at an angle greater than that of a first ion implantation angle.

U.S. Pat. No. 5,045,898 relates to a CMOS integrated circuit wherein a p-type tub is isolated from the n-type tub by means of a field oxide having a p-type channel stop region formed by a boron ion implant. The depth of the ion implant is selected so that the peak of the boron concentration is located immediately under the field oxide region that is subsequently grown. Moreover, the implant is allowed to penetrate into the active device regions thus producing a retrograde boron concentration in the n-channel region. This technique is said to simultaneously improve device isolation and n-channel transistor punchthrough characteristics which allow the extension of CMOS technology to sub-micron device geometries.

U.S. Pat. No. 4,417,385 relates to a process for manufacturing insulated-gate semiconductor devices with integral shorts. One alternative method disclosed in this patent comprises providing a bare semiconductor surface in the region between the gate electrodes followed by diffusing base region impurities into the region between the gate electrodes while growing minimal oxide. finally, the process entails introducing, by means of ion implantation, impurities appropriate to form the upper electrode region. The implantation of the upper terminal region is accomplished at angles that allow for the implantation of the entire area between the gate electrodes.

U.S. Pat. No. 4,855,247 relates to a process for fabricating self-aligned silicide lightly doped drain MOS device. In one embodiment of the invention, after the self-aligned silicide is formed, the sidewall spacer is removed, and light and heavy ion implantation steps are sequentially performed. The implant conditions are optimized to utilize the different silicon dioxide thicknesses over the source/drain regions. This selection can be accomplished by using 2 different species of the same polarity, e.g., arsenic and phosphorous for the n-type dopant, which have significantly different penetration depths. Likewise, it can also be accomplished by using the same species but with different implant energies resulting in different penetration depths.

U.S. Pat. No. 4,698,899 relates to a field effect transistor (FET) having a channel region which is heavily doped under the gate and between the gate and the source of the FET. The channel region between the gate and the drain is lightly doped. The FET is formed on a heavily doped semiconductor substrate. This patent also discloses a method of making the above FET semiconductor device. As part of this process it is disclosed that an ion beam is directed at a predetermined angle such that a first portion of the channel region adjacent the source region is heavily doped and a second portion of the channel region is not exposed due to the height of the masked layer at the gate location. Also disclosed as part of the process is an ion implantation conducted at a second predetermined angle such that the portion under the gate location is substantially heavily doped, thus effectively extending the first heavily doped portion.

U.S. Pat. No. 3,660,735 discloses a complementary metal insulator silicon field effect transistor pair with self-registered gates. The FET comprises a silicon substrate upon which an insulative silicon dioxide layer is thermally grown and overlaid with a silicon nitride layer protecting the oxide layer from further contamination. An n-enhancement area is produced in the same substrate by the ionic implantation of impurity ions throughout the silicon dioxide and silicon nitride layers to form a p-type conductivity pocket within the silicon substrate. The p-enhancement source region and drain region are implanted with 55 kilo electron volt (Kev) boron ions to a dose of $3 \times 10^{14}$ ions/cm$^2$ to produce junctions in the order of 0.3 to 0.4 microns below the substrate surface. The n-enhancement source region and drain region are implanted with 120 kilo electron volts (Kev) phosphorus ions to a dose of $3 \times 10^{14}$ ions/cm$^2$ to form junction 0.15 microns below the previously implanted p-pocket surface. The preferential doping of the P-enhancement devices with boron and the n-enhancement devices with phosphorus is accomplished by the use of either in-contact or out-of-contact metal masks.

U.S. Pat. No. 4,466,178 relates to a method of making extremely small area PNP lateral transistors. In relevant part the p-type substrate is double energy arsenic planted through one surface to establish a n-region to a given depth. This surface is oxidized and photoresist masked conventionally to open regions for the slots which are ion milled or ODE etched to a given depth. P+ regions are established by the slots by ion implanting at an angle such that the entire depth of the slots is not doped but rather the doping is confined to a region within the double energy n-implanted depth. Drive-in diffusion enlarges the p+ areas for the emitted and collector and oxidation fills the moat insulating regions around the active areas.

U.S. Pat. No. 4,978,626 relates to an LDD transistor process having doping sensitive endpoint etching. As part of the process, the semiconductor structure is subjected to an n+ ion implant which forms the diffusion pockets labelled 38 and 39 in FIG. 1D of this patent. The semiconductor structure is then subjected to a selective n− ion implant whereby diffusion pockets 41 and 42 in FIG. 1E are formed. By the same token, an adjacent gate electrode is masked in the same manner and the semiconductor structure is subjected to a p+ ion implant which forms diffusion pockets 46 and 48 in FIG. 1F. Additionally, the semiconductor structure is also subjected to a p− ion implant which forms the diffusion pockets 50 and 51 in FIG. 1G. The implantation disclosed in this patent appears to be performed by direct ion implantation as opposed to angled implantation.

U.S. Pat. No. 4,975,385 relates to a method for forming one or more lightly doped drain (LDD) regions in an integrated circuit structure wherein there is no offset between the gate electrode and the source and drain regions. In particular, the process comprises forming a polysilicon gate electrode over a semiconductor wafer substrate. Then, the substrate is doped to form one or more n− LDD regions. Additionally, polysilicon is selectively deposited on the polysilicon sidewalls of the polysilicon gate electrode. Next, the substrate is doped to form n+ source and drain regions in the substrate using the selectively deposited polysilicon as a mask over the n− LDD regions previously formed in the substrate. The ion implantation in this patent employs direction implantation as opposed to angled implantation.

U.S. Pat. No. 4,931,408 relates to a method for fabricating a short-channel low voltage DMOS transistor. The method comprises forming an oxide sidewall spacer on the sidewalls of a gate prior to forming the body region of a DMOS transistor. An ion implantation or diffusion process is then conducted to form the body region. Both the gate and the oxide sidewall spacer act as a mask for self-alignment of the body region. After a drive-in step to diffuse the impurities, the body region will extend only a relatively short distance under the gate due to its initial spacing from the edge of the gate. After the body region is formed, the oxide sidewall spacer is removed and impurities are then implanted or diffused into the body region and driven in order to form the source region. Since the extension of the body region under the gate is limited by the oxide sidewall spacer, the channel region between the edge of the source region and body region under the gate may be made shorter resulting in the channel on-resistance of the transistor being reduced. The ion implantation disclosed in this patent appears to be direct ion implantation rather than angled implantation.

However, the doping of a p-type substrate having a n-type channel requires a series of considerations quite distinct from that of the n-type substrate having a p-type channel. For example, NMOS transistors of the same width as PMOS transistors provide roughly two and a half times the current drive because electron mobility is considerably greater than hole mobility.

Complementary MOS (CMOS) is a lower power technology which may exploit the VLSI fabrication techniques better than NMOS technology. The threshold voltages of the n- and p- channel devices in a CMOS circuit should have comparable magnitudes for optimal logic-gate performance. To allow for maximum current-driving capacity, the threshold voltage should also be small, with the minimum value dictated by the need to prevent excessive subthreshold currents. Typical threshold voltages are about +−0.8 V. To reduce the magnitude of the threshold voltage in a PMOS device, especially when using a polysilicon gate, it is necessary to implant the channel with a shallow layer of boron. The dose must be heavy enough to overcompensate the n-surface so that a p- region is formed which is depleted of holes. This shifts the threshold voltage toward more positive values by forming a compensating layer.

The fact that boron is implanted to adjust the threshold voltage for both NMOS and PMOS in CMOS circuits with n-polysilicon gates suggest that a single implant could be used, but it may be decided to use separate implants in order to achieve better short channel behavior by individual optimization of the n- and p-channel devices.

PMOS devices in which boron is used to adjust the threshold voltage exhibit a high susceptibility to punch-through effects, since the boron implant produces a small p-layer with a finite thickness. The potential minimum in the channel is thus moved away from the silicon-oxide interface, causing current to flow below the surface of the device. Such PMOS devices are referred to as "buried-channel transistors". As the potential minimum moves deeper below the surface, the punch-through susceptibility also becomes more pronounced. Leakage currents due to punchthrough in PMOS devices can be a significant problem. Such leakage can cause dissipation of a few tenths of a watt of power in a chip containing one million PMOS transistors.

The most obvious solution is to increase the PMOS device channel length. Another obvious technique is to make the p-buried layer as thin as possible. Another approach is to use a high energy n-implant (e.g., arsenic at 400 keV) in order to place more n-type dopant atoms below the pn-junctions. Finally, to prevent a shallow implanted boron layer from growing thicker, it is necessary to use a reduced thermal budget in order to restrict the process sequence following the implant in order to restrict boron diffusion.

OBJECTS OF THE INVENTION

It is, therefore, an object of the present invention to provide a method for nonuniformly doping a channel region of a p-type transistor.

Another object of the present invention is to provide a method for reducing the punchthrough susceptibility without adversely affecting the performance of a p-type MOSFET device by nonuniformly doping a channel region by means of large angle tilt implantation of a dopant.

SUMMARY OF THE INVENTION

In accordance with the foregoing objectives, there is provided a method for nonuniformly doping a channel region in a p-type MOSFET. The method comprises providing a n-type semiconductor substrate and forming a gate insulating film on the substrate. Next, a conductive layer is formed upon the gate insulating film. The substrate is doped with a p-type dopant to a first impurity concentration. The substrate is then doped with an n-type dopant to a second impurity concentration which is lower than the first impurity concentration. The n-type dopant is implanted at an angle greater than 0° and less than 90° from a line drawn perpendicular to the surface of the substrate. Finally, the substrate is thermally treated to activate the dopant materials.

Also in accordance with the foregoing objectives there is provided a p-type MOSFET device having a nonuniformly doped channel region. The device comprises an n-type semiconductor substrate, a gate insulating film on the substrate, and a conductive layer upon the gate insulating film. The substrate has a first region which contains a p-type dopant having a first impurity concentration and a n-type doped region having a second impurity concentration which is lower than the first impurity concentration. The n-type dopant is implanted at an angle greater than 0° and less than 90° from a line drawn perpendicular to the surface of the substrate at the center of the channel.

BRIEF DESCRIPTION OF THE DRAWINGS

FIG. 1 is a cross-section view of a portion of a PMOS device showing various stages of the method according to the present invention.

DETAILED DESCRIPTION OF THE PREFERRED EMBODIMENTS

FIG. 1 illustrates a portion of a p-type MOSFET device in accordance with the present invention. Except for specific processing methods employed to carry out the purposes of the present invention, the device is processed according to conventional methods.

As illustrated in FIG. 1, a semiconductor substrate is provided and is appropriately doped so as to be of the n-type 10. In accordance with conventional processes, a field oxide layer 11 may then be grown on the substrate 10, e.g., by exposing the substrate to oxygen at a high temperature, so as to form an insulating layer of silicon oxide 11. This layer is etched in a patterned fashion so as to define active areas on the chip or wafer. A thin silicon oxide layer is then grown over the entire substrate. This oxide layer ultimately forms gate oxide 13 which defines the channel. Over this thin oxide layer, a layer of polycrystalline silicon is the deposited and heavily doped with an n-type dopant so as to provide a material exhibiting high electrical conductivity. This layer eventually forms gate electrode 14. Alternatively, it is also possible to deposit metal rather than doped polycrystalline silicon as the gate electrode material. Whatever the particular gate electrode material, a mask is subsequently provided to produce a gate electrode and electrode interconnection patterns as desired. The patterns are created by selective removal of the polycrystalline silicon or metal gate electrode material which leaves a thin oxide layer in the channel.

At this point, the semiconductor substrate is doped with a p-type dopant such as boron to form a source and drain region 15. The boron may be implanted by any appropriate method. It is noted that the entire area of the source and drain region are implanted with the p-type dopant, i.e., there are no "gaps" or regions in the source or drain that do not contain a substantial amount of dopant material. The ion implantation energy is sufficient to implant the p-type dopant into the source and drain regions to a depth of up to about 0.1–0.4 micrometers or slightly more as desired. For example, boron ions may be implanted at a voltage of approximately 30–80 Kev. The p-type dopant is implanted at a dosage greater than about $10^{16}$ atoms/cm$^2$, and preferably greater than about $10^{17}$ atoms/cm$^2$. In a preferred embodiment according to the present invention, the boron atoms are implanted into the source and drain regions to a concentration ranging from about $10^{18}$–$10^{21}$ atoms/cm$^3$.

A second doping (represented by 12) with an n-type dopant such as arsenic and phosphorus is implanted at a position beneath the gate oxide layer by ion implanting the dopant at an angle greater than 0° from a line perpendicular from the surface of the substrate and centered over the channel as shown. For example, phosphorus ions may be implanted at an angle of about 45° from vertical so as to form a region implanted phosphorus 16, one pocket directly beneath the gate oxide layer and adjacent the source region and the second also directly beneath the gate oxide layer but adjacent the drain region. The precise dosage and angle of the implants as well as the thermal cycle used to activate the dopants is optimized for maximum punchthrough resistance, the desired threshold voltage, the reduction of parasitic capacitance and increased current mobility, while also retaining the performance of the semiconductor device, e.g., high junction breakdown voltages, low junction capacitances, and high carrier mobility. For example, the phosphorus dopant may be implanted at an angle from about 5° to about 75° from the perpendicular. The concentration of the phosphorus atoms in the pocket implant is preferably less than about $10^{18}$ atoms/cm$^3$. In a particularly, preferred embodiment of the present invention the concentration of the phosphorus atoms in the pocket implant dosage ranges from about $10^{12}$ to about $10^{14}$ atoms/cm$^2$. It is also noted that the pocket implants 16 may be formed before or after the source and drain regions 15 as desired.

As an additional step, the substrate containing the n-type and p-type dopants is treated to activate the dopants. The thermal treatment is conducted at a temperature sufficient to activate the dopants but not so high as to cause any significant drive or migration of the dopants which would adversely affect the performance of the MOSFET device. For example, the substrate is typically annealed at a temperature less than about 1000° C. and preferably less than about 950° C., and more preferably less than about 900° C.

Accordingly, by the method of the present invention, it is possible to prepare a nonuniformly doped semiconductor device having improved punchthrough capabilities that substantially retains the desired performance capabilities such as junction breakdown voltages, junction capacitance and carrier mobilities. Specifically, with the present invention, the first impurity concentration and the second impurity concentration are sufficient to reduce punchthrough suspectability while maintaining a threshold voltage of about −0.5 to −0.9 and V.

While the invention has been described in terms of various preferred embodiments, the skilled artisan would appreciate it that various modifications, substitutions, omissions, and changes may be made without departing from the spirit thereof. Accordingly, it is intended that the scope of the present invention be limited solely by the scope of the following claims, including the equivalence thereof.

What is claimed is:

1. A method for nonuniformly doping a channel region in a p-type MOSFET comprising the steps of:
   (A) providing an n-type semiconductor substrate;
   (B) forming a gate insulating film on said substrate;
   (C) forming a conductive layer upon said gate insulating film, which forms the gate electrode;
   (D) doping the entire source and drain regions of said substrate with a p-type dopant to a first impurity concentration, which is self-aligned to the gate electrode;
   (E) doping said substrate with an n-type dopant to form first and second pockets containing n-type dopant and having a second impurity concentration that is lower than said first impurity concentration, wherein said n-type dopant is implanted at an angle greater than 0° from a line drawn perpendicular to the surface of said substrate and wherein said first pocket is beneath the gate insulating layer and adjacent to the source region and said second pocket is beneath the gate insulating layer and adjacent to the drain region; and (F) thermally treating said substrate to electrically activate said dopants.

2. The method of claim 1, wherein said n-type dopant is arsenic or phosphorus.

3. The method of claim 1, wherein said p-type dopant is boron.

4. The method according to claim 1, wherein the steps of doping with the p-type dopant and doping with the n-type dopant are effected in order to reduce punch-through susceptibility of the p-type MOSFET and wherein the p-type MOSFET has a threshold voltage of about −0.5 to −0.9 V.

5. The method according to claim 4, wherein said p-type dopant is implanted at a dosage greater than about $10^{16}$ atoms/cm$^2$.

6. The method according to claim 4, wherein said p-type dopant is implanted at a dosage greater than about $10^{17}$ atoms/cm$^2$.

7. The method according to claim 6, wherein said first impurity concentration ranges from about $10^{18}$–$10^{21}$ atoms/cm$^3$.

8. The method according to claim 4, wherein said n-type dopant is implanted at a dosage from about $10^{12}$ to about $10^{14}$ atoms/cm$^2$.

9. The method according to claim 8, wherein said second impurity concentration is less than about $10^{18}$ atoms/cm$^3$.

10. The method according to claim 1, wherein said angle at which said n-type dopant is implanted ranges from about 5° to about 75°.

11. The method according to claim 10, wherein said step of thermally treating said substrate is performed at a temperature which is less than about 950° C.

12. The method according to claim 1, wherein said thermal treatment is conducted at a temperature that activates said dopants but the temperature is not high enough to cause any significant drive or migration of said dopants.

13. The method according to claim 12, wherein said temperature is less than about 900° C.

14. The method according m claim 1, wherein said step of thermally treating said substrate is performed at a temperature which is less than about 1000° C.

15. The method of claim 1 wherein said p-type dopant is implanted at a dosage greater than about $10^{17}$ atoms/cm$^2$.

16. The method according to claim 15 wherein said n-type dopant is implanted at a dosage from about $10^{12}$ to about $10^{14}$ atoms/cm$^2$.

17. The method according to claim 16 wherein said temperature is less than about 900° C.

18. The method according to claim 1 wherein said first impurity concentration ranges from about $10^{18}$–$10^{21}$ atoms/cm$^3$.

19. The method according to claim 18 wherein said second impurity concentration is less than about $10^{18}$ atoms/cm$^3$.

20. The method according to claim 19 wherein said temperature is less than about 900° C.

* * * * *